United States Patent [19]
Takaoka

[11] Patent Number: 4,718,073
[45] Date of Patent: Jan. 5, 1988

[54] DEMODULATOR FOR FACSIMILE EQUIPMENT

[75] Inventor: Kazuhiko Takaoka, Kanagawa, Japan

[73] Assignee: Hitachi, Ltd., Tokyo, Japan

[21] Appl. No.: 881,959

[22] Filed: Jul. 3, 1986

[30] Foreign Application Priority Data

Jul. 9, 1985 [JP] Japan .................... 60-149215

[51] Int. Cl.⁴ .............................. H03H 7/30
[52] U.S. Cl. .......................... 375/14; 333/18; 364/724
[58] Field of Search .................... 375/12, 13, 14, 15, 375/16; 333/18; 364/724; 381/103

[56] References Cited

U.S. PATENT DOCUMENTS 3,868,603  2/1975  Guidoux .................... 375/15
4,146,840  3/1979  McRae et al. .............. 375/12
4,438,521  3/1984  Mattei ...................... 375/16
4,575,857  3/1986  Murakami ................. 375/14
4,597,088  6/1986  Posti et al. ................ 375/12

Primary Examiner—Robert L. Griffin
Assistant Examiner—Stephen Chin
Attorney, Agent, or Firm—Antonelli, Terry & Wands

[57] ABSTRACT

A demodulator for facsimile equipment in which there is provided a memory for storing equalizer coefficients of an automatic equalizer and a divergence detector for detecting divergence of the automatic equalizer, and in which equalizer coefficients of the automatic equalizer established at the beginning of transmission or reception are stored in the memory. In the event of divergence of the automatic equalizer during reception of a subsequent picture data message, the stored equalizer coefficients are re-set in the automatic equalizer.

2 Claims, 5 Drawing Figures

DEMODULATOR FOR FACSIMILE EQUIPMENT

BACKGROUND OF THE INVENTION

The present invention relates to a demodulator for facsimile equipment and particularly to a MODEM for facsimile equipment incorporating an automatic equalizer.

Generally, in the case of performing a high speed data transmission through a transmission line (circuit) of a limited frequency band, received data are influenced by various deterioration factors, e.g. attenuation distortion and delay distortion. In this state, therefore, it is difficult for a receiving section to effect data identification. In order to correct the above distortions, an equalizer is provided within a MODEM.

Since the circuit distortions are not constant but vary with the lapse of time, it is required to maintain an optimum state of reception by following variations in circuit characteristics and correcting equalizer coefficients. Particularly, in a polyphase, multi-level modulation system, the interval between transmission data is so narrow that the deterioration factors on the transmission line have a great influence. Therefore, the demand for maintaining an optimum receiving state is strong.

In this connection, there is used an automatic equalizer for obtaining an optimum state of reception by performing an arithmetic processing in a real-time manner at every time slot, changing equalizer coefficients according t the result of the calculation and correcting a received signal.

In a demodulator for facsimile equipment there is used a complex type MSE method equalizer as an equalizer conforming to the CCITT Recommendation T.4 modulation system which is a polyphase multi-level modulation system In a conventional complex type MSE method automatic equalizer, when the deterioration of circuit characteristics is slight and there is little error between equalizer output data and signal spot arrangement, equalizer coefficients are corrected exactly and there is performed an automatic equalization. But in the case of a large error caused by a large change in transmission characteristics for example, there will not be made an exact correction, but rather the correction will be made in an undesirable direction. If the error is an instantaneous error, a correctly modified value will finally be obtained through successive modifications. On the other hand, in the event a large erro continues to exist for a relatively long period, there will not be obtained an exact correction value. This state is called divergence or equalization error.

In facsimile equipment, there is provided, for a certain period, a training check signal (TCF) for placing an automatic equalizer in an operable state prior to the normal data transmission according to the binary system procedure defined by CCITT Recommendation T.30, to thereby set equalizer coefficients of the automatic equalizer, and thereafter a picture data message is provided. Therefore, in the event of divergence or equalization error caused by some line trouble, this will result in loss of picture data even under progress of the procedure in facsimile equipment. In the conventional demodulator having an automatic equalizer, there is no method to cope with such situation and it is has been necessary to start the transmission over again.

As to the correction of equalizer coefficients in a conventional complex type MSE method automatic equalizer, such is described in Japanese Patent Laid-Open Publication No. 109434/82.

SUMMARY OF THE INVENTION

It is an object of the present invention to provide a demodulator for facsimile equipment capable of improving the communication probability of facsimile communication.

It is another object of the present invention to provide a demodulator for facsimile equipment in which even in the event of divergence of an automatic equalizer incorporated in the demodulator during reception of a picture data message, its recovery can be effected.

It is a further object of the present invention to provide a demodulator for facsimile equipment in which even in the event of divergence of an automatic equalizer incorporated in the demodulator during reception of a picture data message, reception can be continued without requesting re-transmission to the transmitter.

The above objects are attained by the present invention in which a memory for storing equalizer coefficients of an automatic equalizer and a divergence detector for detecting divergence of the automatic equalizer are provided and there are stored in the memory equalizer coefficients of the automatic equalizer established at the beginning of transmission or reception, Then in the event of divergence of the automatic equalizer during reception of a subsequent picture data message, the stored equalizer coefficients are re-set in the automatic equalizer.

DETAILED DESCRIPTION OF THE INVENTION

Figure 1:
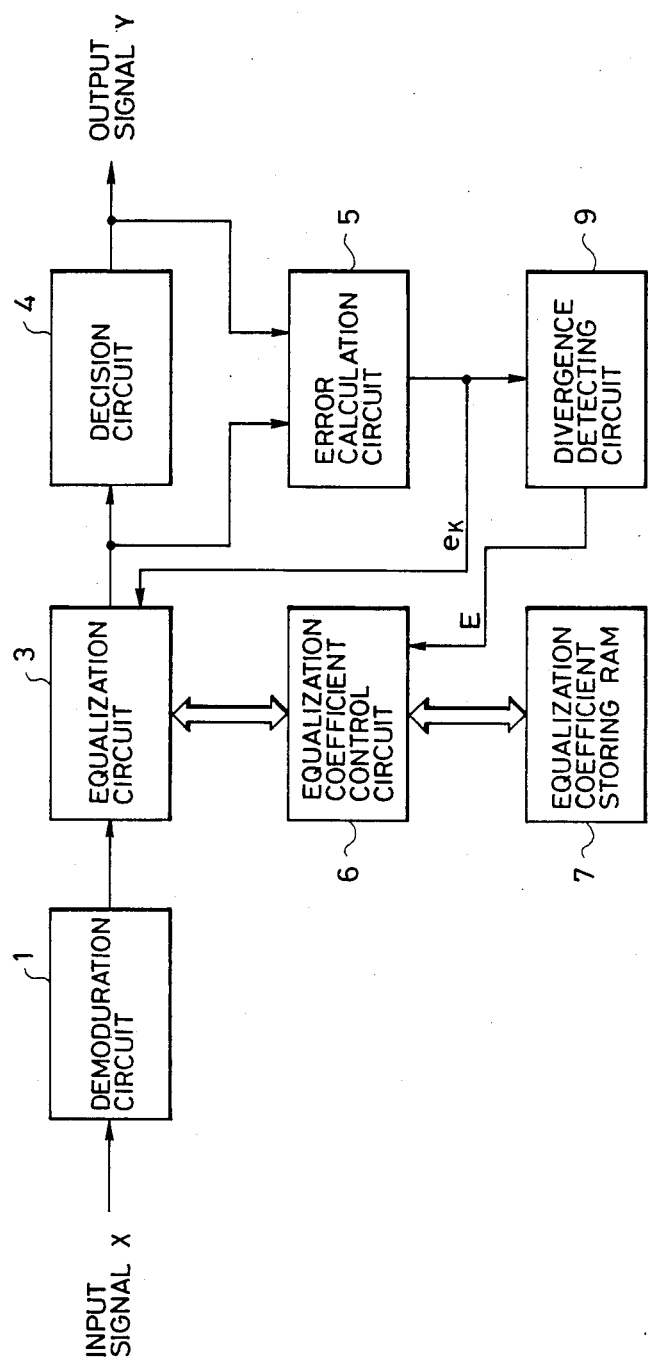
FIG. 1 is a block diagram showing function and construction of a demodulator for facsimile equipment according to the present invention.

FIG. 1 illustrates a construction of a MODEM for facsimile equipment according to the present invention, in which an input signal X in a modulated state is demodulated in a demodulation circuit 1 and then equalized by an automatic equalizer comprising an automatic equalization circuit 3, a decision circuit 4 and a error calculation circuit 5.

In the demodulator for facsimile equipment according to the present invention, in addition to the above components there are provided a divergence detecting circuit 9, an equalizer coefficient storing RAM 7 and an equalizer coefficient control circuit 6. At the beginning of communication, equalizer coefficients in the automatic equalization circuti 3 set up by the equalizer coefficient control circuit 6 are stored in the equalizer coefficient storing RAM 7, and when divergence of the automatic equalizer is later detected by the divergence detecting circuit 9, the equalizer coefficients stored in the equalizer coefficient storing RAM 7 are re-set in the automatic equalization circuit 3.

More particularly, the demodulator for facsimile equipment according to the present invention can be constructed as follows using a signal processor.

Figure 2:
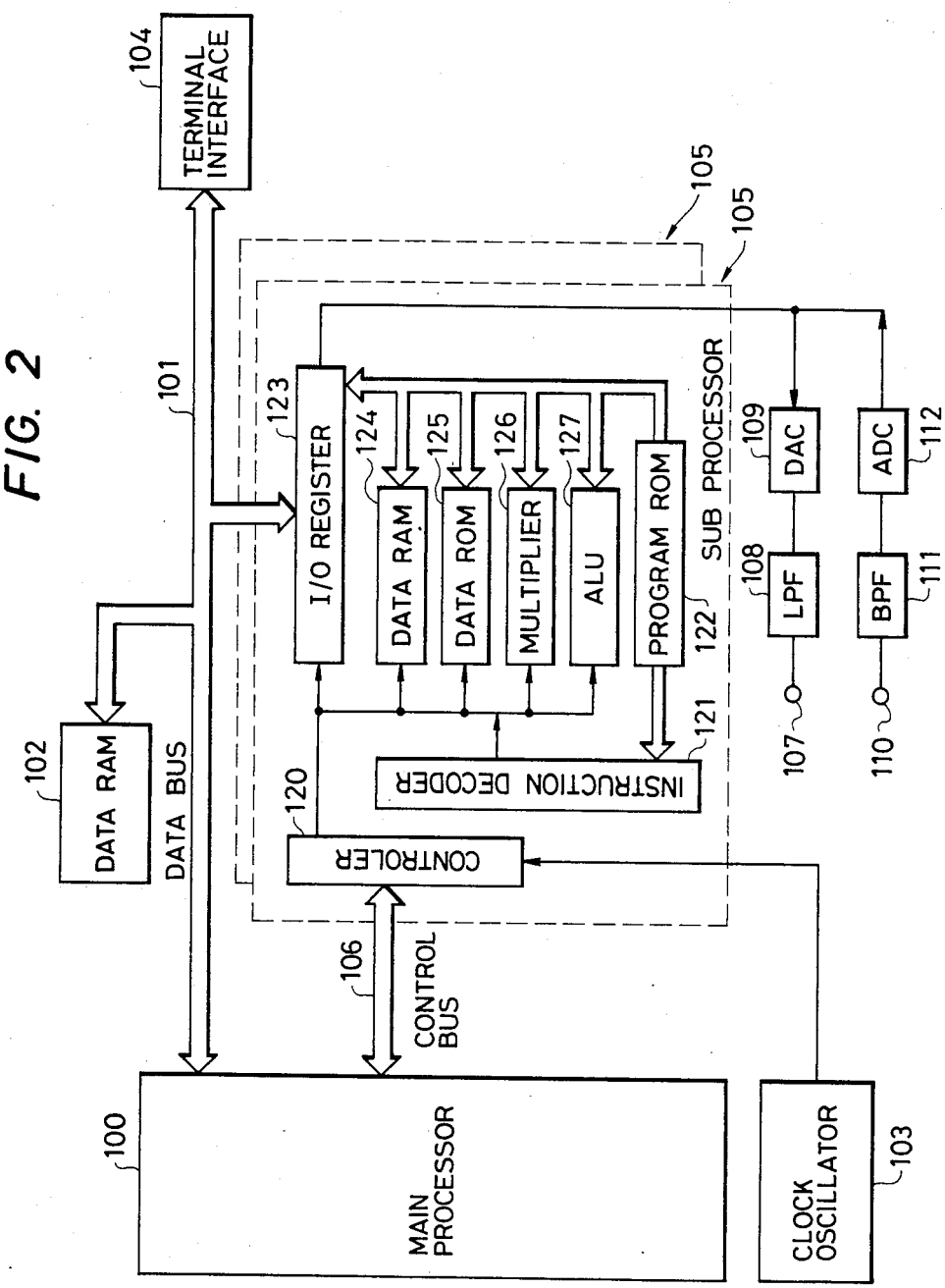
FIG. 2 is a block diagram of a demodulator for facsimile equipment constructed using a signal processor according to the present invention.

FIG. 2 shows a basic construction example of a signal processor which implements the demodulator for facsimile equipment according to the present invention. A main processor 100 and a sub processor 105 are interconnected through a data bus 101 and a control bus 106. The main processor 100, which is constituted by a digital processor, is a control unit for controlling the entire operation of the demodulaor of the invention. The sub processor 105, which is constituted by a digital signal processor, mainly functions to realize modem functions such as filter functions and circuit equalizing function. In the sub processor, division of load or task can be attained by connecting plural units of the same construction in parallel.

The sub processor 105 has a control section 120, instruction decoder 121, I/O register 123, data RAM 124, data ROM 125, multiplier 126, arithmetic and logical unit (ALU) 127, and program ROM 122. In the program ROM there are stored, as a program sequence, instructions for executing in this system such functions as filter function and equalizing function of the modem. These instructions are interpreted by the instruction decoder 121. The control section 120, which is connected to the control bus 106, receives instructions from the main processor 100, interprets them and instructs the operation of each portion in the sub processor 105.

The data RAM 124 and data ROM 125 are storage areas for storing various data necessary for executing the filter and equalizer functions. For example, a filter tap coefficient is stored therein. The multiplier 126 and ALU 127 execute operations on the data in the data RAM 124 and data ROM 125 in response to the instructions stored in the program ROM 122 or the instructions issued from the main processor and realizes desired functions as the modem, including filter functions. The I/O register 123 is connected to the data bus 101, which in turn is connected to a terminal interface 104. The terminal interface 104 is connected to a facsimile control system. The I/O register 123 is also connected to a digital-analog converter (DAC) 109 and an analog-digital converter (ADC) 112. The DAC 109 is connected through a low pass filter (LPF) 108 to a transmission line 107 of an analog communication circuit such as a telegraph line, while the ADC 112 is connected to a reception line 110 through a band pass filter (BPF) 111.

The sub processor 105 realizes functions as the modem by digital processing in response to sampling clocks provided from a clock generator 103. The signal received from the reception line 110 is taken in the sub processor from the I/O register 123 through BPF 111 and ADC 112, and is subjected to a demodulation processing.

More specifically, for the received signal which has been converted to a digital signal in the ADC 112, there are executed, in the sub processor 105 the functions of demodulation circuit 1, automatic equalization circuit 3, decision circuit 4 and error calculation circuit 5 as shown in FIG. 1.

Figure 3:
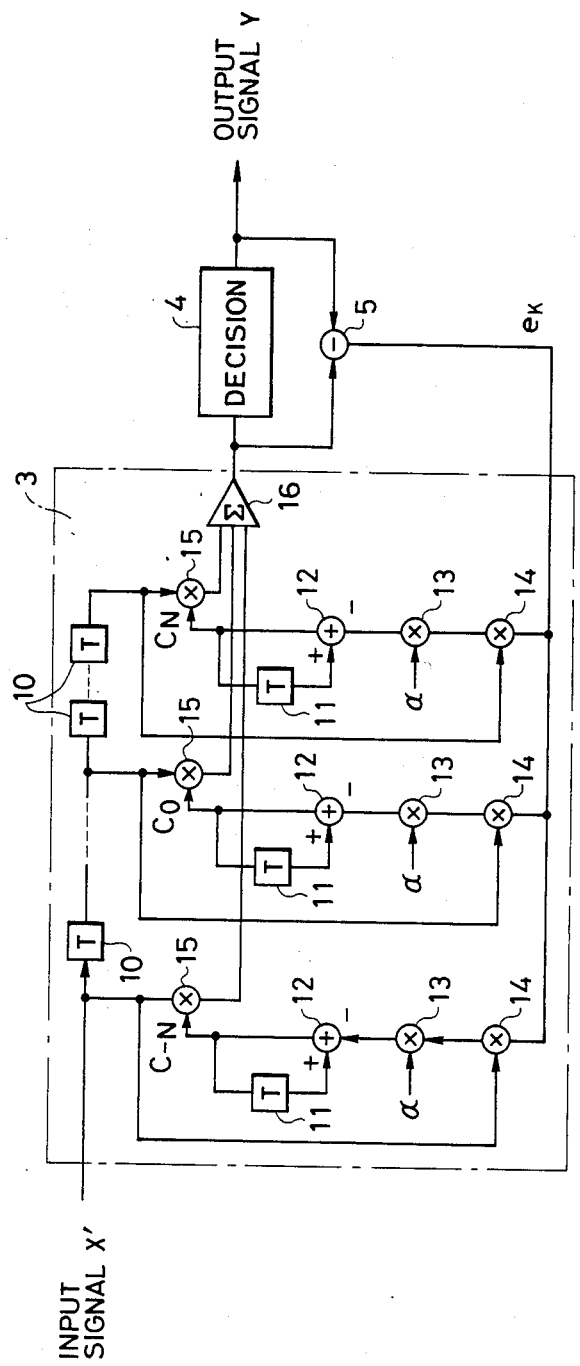
FIG. 3 is a diagram showing a processing concept of an equalizer.

An automatic equalizer circuitry is composed of the automatic equalization circuit 3, decision circuit 4 and error calculation circuit 5, as shown in FIG. 1. FIG. 3 illustrates a processing embodiment of this equalizer. The equalizer is composed of multiplication circuits 13–15, addition circuits 12 and 16, an equlizer coefficient RAM 11 and a delay RAM 10. From the addition circuits 12 are obtained equalizer coefficients C-N, Co and CN, which coefficients are updated as follows by a decision output error ek:

ti $Cjtl = Cj - a \cdot ek \cdot Xj^*$ wherein $a$ is a coefficient updating gain. As this value becomes larger, a higher speed equalization can be effected.

The above automatic equalizer function is executed by performing operations in accordance with the instruction sequence of the main processor 100 or the program sequence stored in the program ROM 122 of the sub processor. The equalizer coefficients are stored in the data RAM 124 of the sub processor and are subjected to arithmetic processing on demand. The equalizer coefficient RAM is determined according to the amount of delay in the equalization. For the equalization of a telegraph line (for general purposes), 32 tap general (32×2 words) are provided and the write and read for the RAM should be done at a high speed of 30 to 50 NS.

In this invention, when it is decided that the equalizer has obtained its full equalizing function, the equalization control circuit is operated so as to transfer and store the equalizer coefficients and the data RAM 124 from the main processor 100 in the equalization storing RAM 7 of the main processor RAM 102 via the I/O register 123 and the data bus 101 by means of the control section 121. As the main processor RAM 102 a RAM for general purpose which operates at 500 NS−1 $\mu$s is used because it is needless to operate at a high speed like the data RAM 124 of the sub-processor 105.

When divergence of the equalizer is detected by the divergence detecting circuit 9, which detects divergence by comparing an integrated value obtained by adding output values of the error calculation circuit 5 in the automatic equalizer for a certain period with an integrated value (threshold) at the time of divergence of the equalizer, the equalizer coefficients are re-set from the main processor RAM 102 to the equalizer coefficients data RAM 102 via the data bus 101 and the I/O register 123 by means of the control section 121.

The following description is now provided about re-setting of the equalizer coefficients in the facsimile procedure.

Figure 4:
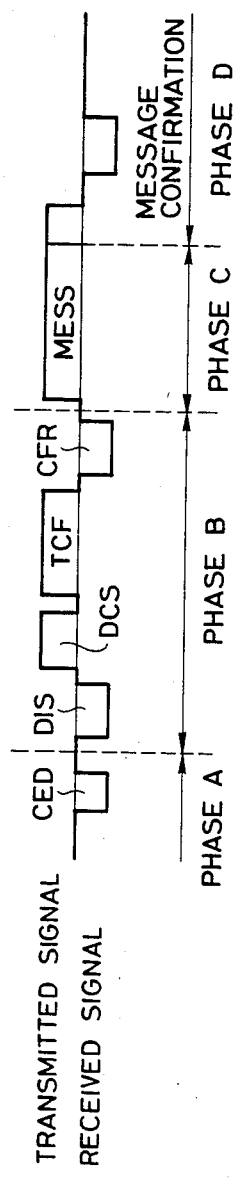
FIG. 4 is a diagram showing transmitted and received signals in G3 facsimile equipment on transmission and reception sides.

FIG. 4 illustrates transmitted and received signals in G3 facsimile equipment. CED in phase A represents a tonal signal, while in phase B there are transmitted and received signals for procedure before message such as DIS (digital identification signal), DCS (digital command signal), TCF (training check signal) and CFR (reception ready confirmation signal). The training check signal TCF is subjected to modulation and demodulation by the T.4 modulation system and "0" date is provided to the reception side for 1.5 seconds. When in phase B the transmission side receives the CFR signal, there is made transfer to phase C. In phase C, a picture data message MESS is transferred from the transmission side to the reception side at high speed through the T.4 modulation system. Phase D, which represents a procedure after message, confirms the end, etc.

In G3 facsimile picture transmission, the lock-in of the built-in automatic equalizer is completed by a synchronizing signal contained in the TCF signal in phase B and that in the MESS signal in phase C, and succeeding data are equalized and demodulated. But in the event of an equalization error caused by the foregoing trouble of the equalizer, there results loss of picture data even under progress of the procedure in the facsimile and it is no longer possible to receive picture data correctly.

In the demodulator for facsimile equipment according to the present invention, equalizer coefficients of the automatic equalizer are re-set in the following manner.

Figure 5:
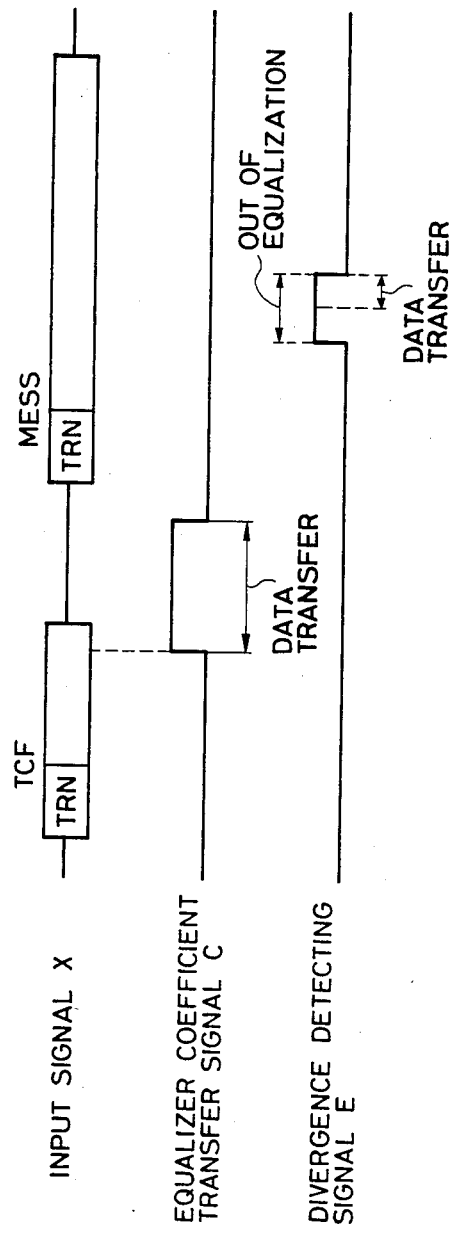
FIG. 5 is a time chart for explaining the operation of the demodulator for facsimile equipment according to the present invention.

FIG. 5 is a timing chart for explanation of operations. A signal TRN for initially setting equalizer coefficients of the automatic equalizer is added to the foremost part of the training check signal TCF and that of the picture data message MESS both explained in connection with FIG. 4. In the automatic equalizer in which the TCF signal has been received in phase B, an initializing lock-in operation is executed by the synchronizing signal TRN. Once the lock-in is established thereby, the equalizer coefficients assume a certain stable state and the "0" data in the TCF signal is demodulated. If the said data is demodulated correctly for one second, the equalizer coefficients in the automatic equalization circuit 3 will be transferred to and stored in the equalizer coefficient storing RAM 7 throught the equalizer coefficient control circuit 6. In this case, the RAM 7 need not operate at high speed. It is sufficient for it to complete the transfer in a signal-free section (1 to 1.5 seconds) between the signals TCF and MESS.

After termination of the TCF signal, the CFR signal is provided to the facsimile transmission side and soon thereafter, in phase C, the MESS signal is provided from the facsimile transmission side to the facsimile reception side. Also, upon receipt of the MESS signal, the automatic equalizer is re-established and the message data is demodulated while the equalizer coefficients are updated if necessary. In the event of failure in re-establishment of the equalizer with the synchronizing signal affixed to the front part of this message, or in the event of divergence of the equalizer due to trouble of the transmission line for example, there is performed an equalizer recovery processing. But in the case of continuance of a relatively large decision output error, it becomes no longer possible to demodulate the picture data.

In the demodulator for facsimile equipment according to the present invention, when such state is detected by the divergence detecting circuit 9, the equalizer coefficient control circuit 6 judges that this state is divergence, on the basis of a divergence detection signal E provided from the divergence detecting circuit 9, and transfers the equalizer coefficients prestored in the equalizer coefficient storing RAM 7 and established by the TCF signal, to an equalizer coefficient holding RAM incorporated in the automatic equalization circuit 3.

The equalizer coefficients stored in the equalizer coefficient storing RAM 7 and established by the TCF signal are transferred after several to several ten of seconds at the most. In addition, the time of the phase section B-C section is short and there is n large circuit variation. Therefore, the recovery of equalization can be fully effected in the construction of the present invention.

What is claimed is:

1. A demodulator for facsimile equipment, comprising:

a demodulating means for demodulating an input signal;

an automatic equalizer means for automatically equalizing an output signal provided from said demodulating means;

a decision means for making an area decision on an output signal provided from said automatic equalizer means;

an error calculating means for performing an error calculation between an output signal provided from said decision means and an output signal from said automatic equalizer means;

a memory means for storing equalizer coefficients of said automatic equalizer means;

a divergence detecting means for detecting divergence of said automatic equalizer means based on the calculation performed by said error calculating means; and an equalizer coefficient controlling means which, upon detection of divergence of said automatic equalizer means by said divergence detecting means, transfers the equalizer coefficients stored in said memory means to said automatic equalizer means to re-set the equalizer coefficients of the automatic equalizer means.

2. A demodulator for facsimile equipment according to claim 1, wherein the equalizer coefficients stored in said memory means are equalizer coefficients established in said automatic equalizer means at the time of reception of a training check signal in a facsimile communication.

* * * * *